United States Patent
Wang

(10) Patent No.: US 9,117,871 B2
(45) Date of Patent: Aug. 25, 2015

(54) MULTI-AXIAL ACCELERATION SENSOR AND METHOD OF MANUFACTURING THE SAME

(71) Applicant: PixArt Imaging Inc., Hsin-Chu (TW)

(72) Inventor: Wei-Chung Wang, Hsin-Chu (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/962,955

(22) Filed: Aug. 9, 2013

(65) Prior Publication Data

US 2014/0231935 A1 Aug. 21, 2014

(30) Foreign Application Priority Data

Feb. 20, 2013 (TW) .............................. 102105910 A

(51) Int. Cl.
*H01L 21/00* (2006.01)
*H01L 23/00* (2006.01)
*G01P 15/18* (2013.01)

(52) U.S. Cl.
CPC ................ *H01L 24/73* (2013.01); *G01P 15/18* (2013.01); *H01L 2224/32225* (2013.01); *H01L 2224/48091* (2013.01); *H01L 2224/48227* (2013.01); *H01L 2224/49175* (2013.01); *H01L 2924/07802* (2013.01)

(58) Field of Classification Search
CPC ................ H01L 2924/00; H01L 2224/73265; H01L 2924/00014; H01L 2924/1461; H01L 2224/48227; H01L 2224/48247; H01L 2224/32225; H01L 2224/48091; H01L 2924/00012; H01L 2224/32145; H01L 2224/92247
USPC ............ 257/415, 419, 676, E23.031; 438/51, 438/106; 73/514.32, 514.16
See application file for complete search history.

(56) References Cited

U.S. PATENT DOCUMENTS

| | | |
|---|---|---|
| 2005/0109108 A1 | 5/2005 | Chen |
| 2008/0283991 A1* | 11/2008 | Reinert ......................... 257/685 |
| 2011/0272769 A1 | 11/2011 | Song |
| 2012/0217286 A1 | 8/2012 | Hawat |

FOREIGN PATENT DOCUMENTS

| | | |
|---|---|---|
| CN | 103288044 A | 9/2013 |
| TW | 201037772 | 10/2010 |
| TW | 201129119 | 8/2011 |

* cited by examiner

*Primary Examiner* — Mark A Laurenzi
(74) *Attorney, Agent, or Firm* — Winston Hsu; Scott Margo

(57) ABSTRACT

The present invention provides a multi-axial acceleration sensor and a method of manufacturing the multi-axial acceleration sensor. The method includes: providing a substrate having a lead plane; disposing a first sensor chip onto the lead plane, wherein a wire bonding plane of the first sensor chip is perpendicular to the lead plane; and disposing a second sensor chip onto the lead plane, wherein a wire bonding plane of the second sensor chip is in parallel with the lead plane.

9 Claims, 5 Drawing Sheets

MULTI-AXIAL ACCELERATION SENSOR AND METHOD OF MANUFACTURING THE SAME

BACKGROUND OF THE INVENTION

1. Field of the Invention

The disclosed embodiments of the present invention relate to semiconductor packaging technology, and more particularly, to a manufacturing method of a multi-axial acceleration sensor and a related multi-axial acceleration sensor.

2. Description of the Prior Art

The conventional tri-axial acceleration sensor has a structure as shown in FIG. 1, wherein a tri-axial acceleration sensor 100 includes an acceleration sensor chip 110 and a package substrate 140. The acceleration sensor chip 110 is bonded to the package substrate 140 through adhesive 145, and the contact pads 132 thereof are connected to the contact pads 144 of the package substrate 140 in a wire bonding manner.

Since a package 120 of the acceleration sensor chip 110 needs an acceleration detection mechanism and related integrated circuits sufficient to sense along three different axes, it therefore requires a more complicated manufacturing process, and suffers from issues such as heat dissipation and mutual interference of sensing signals in different axes. Accordingly, there is need for a different manufacturing method in this field to solve the above-mentioned problems.

SUMMARY OF THE INVENTION

One of the objectives of the present invention is to provide a manufacturing method of a multi-axial acceleration sensor and a related multi-axial acceleration sensor to solve the above-mentioned problems.

According to a first embodiment of the present invention, a manufacturing method of a multi-axial acceleration sensor is disclosed. The manufacturing method includes: providing a substrate, wherein the substrate has a lead plane; disposing a first acceleration sensor chip onto the lead plane, wherein a wire bonding plane of the first acceleration sensor chip is perpendicular to the lead plane; and disposing a second acceleration sensor chip onto the lead plane, wherein a wire bonding plane of the second acceleration sensor chip is in parallel with the lead plane.

According to a second embodiment of the present invention, a manufacturing method of a multi-axial acceleration sensor is disclosed. The manufacturing method includes: providing a substrate, wherein the substrate has a lead plane; disposing a first acceleration sensor chip onto the lead plane, wherein a wire bonding plane of the first acceleration sensor chip is in parallel with the lead plane; and disposing a second acceleration sensor chip onto the lead plane, wherein a wire bonding plane of the second acceleration sensor chip is in parallel with the lead plane.

According to a third embodiment of the present invention, a multi-axial acceleration sensor is disclosed. The multi-axial acceleration sensor includes a substrate, a first acceleration sensor chip, and a second acceleration sensor chip. The substrate has a lead plane. The first acceleration sensor chip is disposed onto the lead plane, wherein a wire bonding plane of the first acceleration sensor chip is perpendicular to the lead plane. The second acceleration sensor chip is disposed onto the lead plane, wherein a wire bonding plane of the second acceleration sensor chip is in parallel with the lead plane.

According to a fourth embodiment of the present invention, a multi-axial acceleration sensor is disclosed. The multi-axial acceleration sensor includes a substrate, a first acceleration sensor chip, and a second acceleration sensor chip. The substrate has a lead plane. The first acceleration sensor chip is disposed onto the lead plane, wherein a wire bonding plane of the first acceleration sensor chip is in parallel with the lead plane. The second acceleration sensor chip is disposed onto the lead plane, wherein a wire bonding plane of the second acceleration sensor chip is in parallel with the lead plane.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
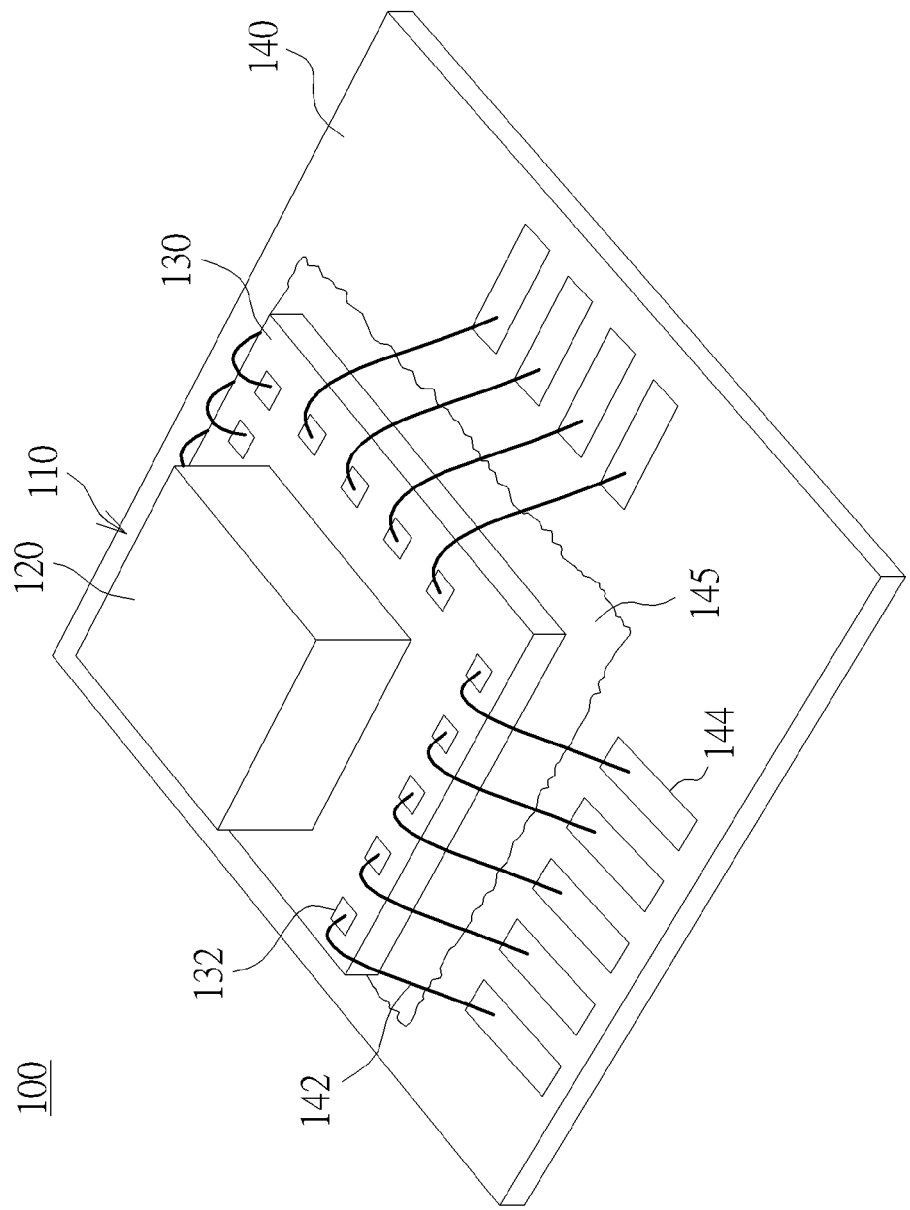
FIG. 1 is a diagram illustrating a conventional multi-axial acceleration sensor.
Figure 2:
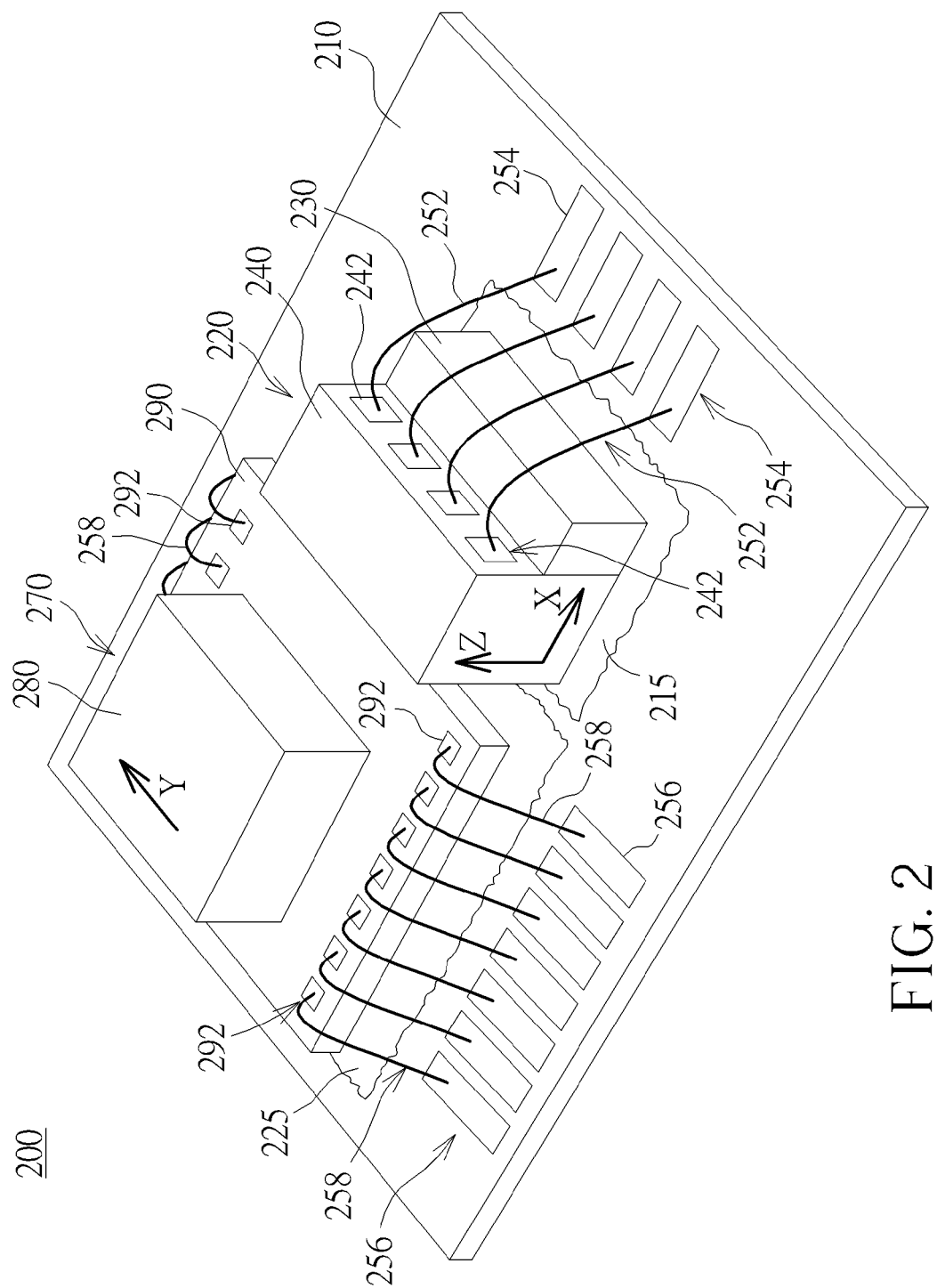
FIG. 2 is a diagram illustrating a structure of a multi-axial acceleration sensor according a first embodiment of the present invention.
Figure 3:
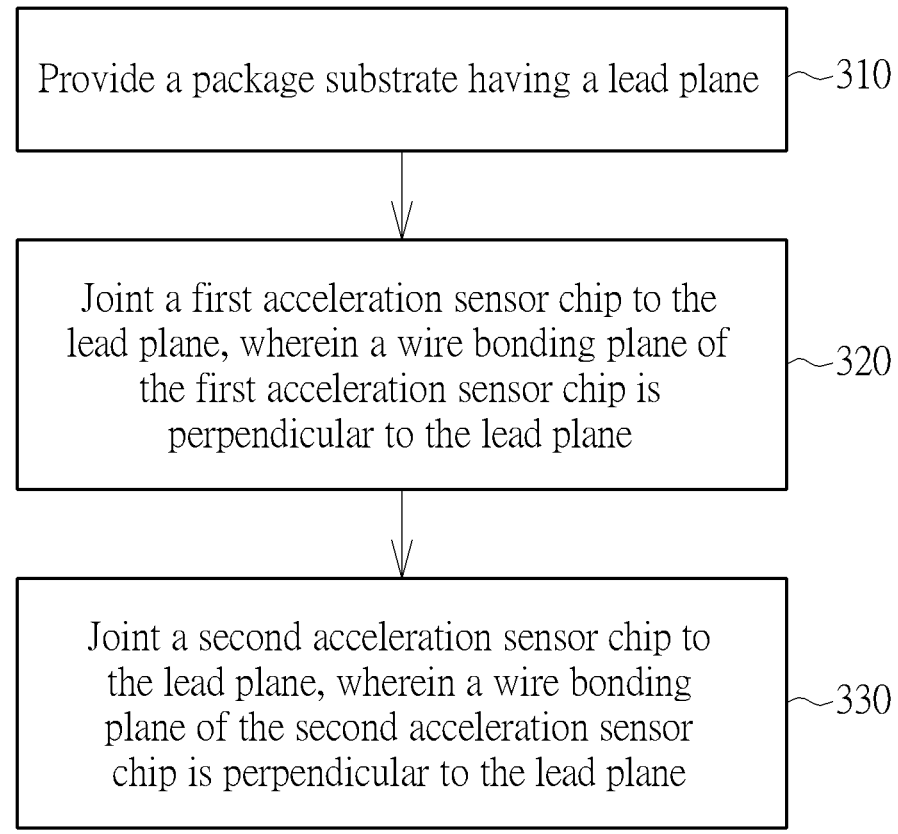
FIG. 3 is a diagram illustrating a manufacturing method of a multi-axial acceleration sensor according the first embodiment of the present invention.

Please refer to FIG. 2 and FIG. 3. FIG. 2 is a diagram illustrating a structure of a multi-axial acceleration sensor according a first embodiment of the present invention. FIG. 3 is a diagram illustrating a manufacturing method of a multi-axial acceleration sensor according the first embodiment of the present invention. Details of the structure and manufacturing method are described as follows. First of all, in the first step 310 of the manufacturing process, a package substrate 210 having a lead plane where contact pads 254, 256 are located is provided. Next, in step 320, a first acceleration sensor chip 220 is jointed to the lead plane of the package substrate 210. The first acceleration sensor chip 220 may be directly placed on the lead plane, or be rotated and then placed on the lead plane, or be flipped and then placed on the lead plane in an upside-down manner. A side plane of a substrate 240 of the first acceleration sensor chip 220 could be bonded to the lead plane via any conductive or non-conductive adhesive 215, so as to allow the first acceleration sensor chip 220 to be firmly disposed on the lead plane. Furthermore, a plurality of contact pads 242 of a wire bonding plane of the first acceleration sensor chip 220 are connected to a plurality of contact pads 254 of the package substrate 210 via a plurality of bonding wires 252 in a wire-bonding manner, wherein the wire bonding plane of the first acceleration sensor chip 220 is perpendicular to the lead plane of the package substrate 210, that is, the contact pads 254 and the contact pads 242 are placed on two planes mutually perpendicular to each other.

Then, in step 330, a second acceleration sensor chip 270 is jointed to the lead plane, wherein the second acceleration sensor chip 270 may be bonded to the lead plane via any conductive or non-conductive adhesive 225, so as to allow the second acceleration sensor chip 270 to be firmly disposed on the lead plane. A plurality of contact pads 292 of a wire bonding plane of the second acceleration sensor chip 270 are connected to a plurality of contact pads 256 of the package substrate 210 via a plurality of bonding wires 258 in a wire-bonding manner, wherein the wire bonding plane of the second acceleration sensor chip 270 is in parallel with the lead plane of the package substrate 210.

The first acceleration sensor chip 220 is composed of the package 230 and the substrate 240. The second acceleration sensor chip 270 is composed of the package 280 and the substrate 290. Each of the packages 230, 280 includes an acceleration detection mechanism and related integrated circuits sufficient to sense along at least one axis. In one embodiment, the first acceleration sensor chip 220 is arranged to deal with two sensing directions, and can be used to perform acceleration detections along Z-axis and X-axis; and the second acceleration sensor chip 270 is arranged to deal with one single sensing direction, and can be used to perform acceleration detection along Y-axis. However, according to other embodiments of the present invention, the first acceleration sensor chip 220 may be configured to deal with only one sensing direction, and can be used to perform acceleration detections along a single axis, while the second acceleration sensor chip 270 may be configured to deal with multiple sensing directions, and can be used to perform acceleration detections along multiple axes. The combinations and alternative designs mentioned above all belong to the scope of the present invention. In any case, the first acceleration sensor chip 220 possesses sensing direction(s) different from that of the second acceleration sensor chip 270. In this way, the multi-axial acceleration sensor 200 is therefore capable of perform multi-axial sensing process for multi-axial acceleration detection.

Besides, for manufacturing convenience, each of the first acceleration sensor chip 220 and the second acceleration sensor chip 270 may be of the same chips, wherein each of the first acceleration sensor chip 220 and the second acceleration sensor chip 270 is capable of performing multi-axial acceleration detection. While being bonded to the lead plane, one of the acceleration sensor chips (e.g., the first acceleration sensor chip 220) is flipped and then placed on the package substrate 210 and is electrically connected to the package substrate 210; besides, one of the acceleration sensor chips has a portion of the contact pads that is not connected to the contact pads of the lead plane. That is, although the first acceleration sensor chip 220 and the second acceleration sensor chip 270 generate acceleration detection results associated with multiple directions, respectively, not all of the acceleration detection results are needed. In general, a three-axial acceleration sensor only requires sensing results in three different directions.

Figure 4:
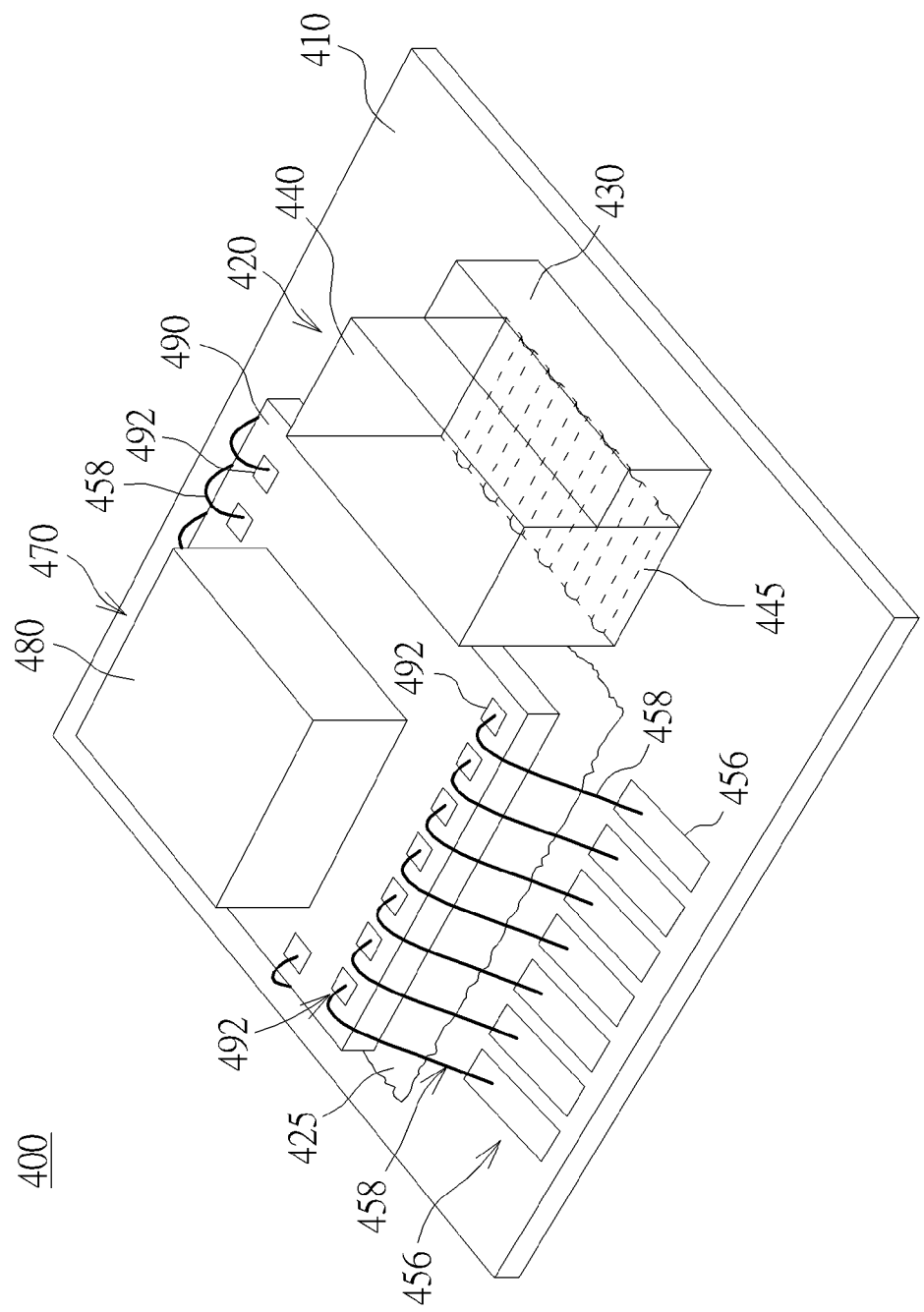
FIG. 4 is a diagram illustrating a structure of a multi-axial acceleration sensor according a second embodiment of the present invention.
Figure 5:
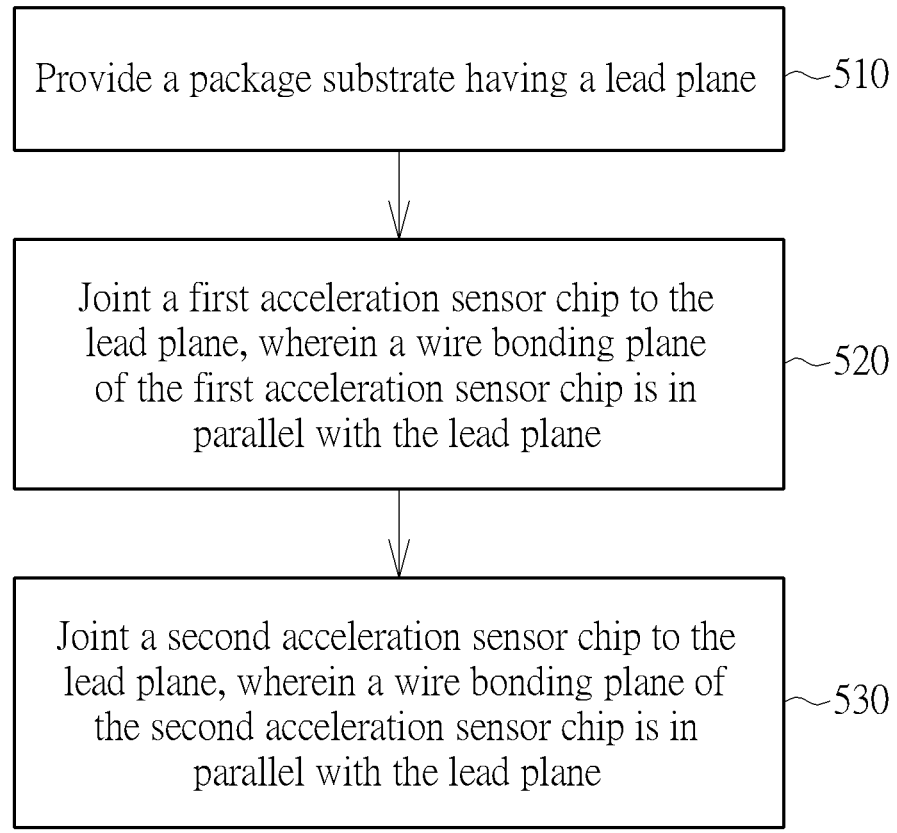
FIG. 5 is a diagram illustrating a manufacturing method of a multi-axial acceleration sensor according the second embodiment of the present invention.

Please refer to FIG. 4 and FIG. 5. FIG. 4 is a diagram illustrating a structure of a multi-axial acceleration sensor according a second embodiment of the present invention and FIG. 5 is a diagram illustrating a manufacturing method of a multi-axial acceleration sensor according the second embodiment of the present invention. Details of the structure and manufacturing method are described as follows. First of all, in the first step 510 of the manufacturing process, a package substrate 410 having a lead plane where contact pads 456 are located is provided. Next, in step 520, a first acceleration sensor chip 420 is jointed to the lead plane of the package substrate 410. The first acceleration sensor chip 420 may be directly placed on the lead plane, or be rotated and then placed on the lead plane, or be flipped and then placed on the lead plane in an upside-down manner. Furthermore, a side plane 445 of a substrate 440 of the first acceleration sensor chip 420 has a plurality of soldering contacts (not shown), which could be bonded to a plurality of contact pads (not shown) of the package substrate 410 via a soldering process, so as to allow the first acceleration sensor chip 420 to be firmly disposed on the lead plane, wherein the lead plane of the package substrate 410 is perpendicular to the substrate 440 of the first acceleration sensor chip 420. Then, in step 530, a second acceleration sensor chip 470 is jointed to the lead plane, wherein the second acceleration sensor chip 470 may be bonded to the lead plane via any conductive or non-conductive adhesive 425, so as to allow the second acceleration sensor chip 270 to be firmly disposed on the lead plane. A plurality of contact pads 492 of a substrate 490 of the second acceleration sensor chip 470 are connected to a plurality of contact pads 456 of the package substrate 410 via a plurality of bonding wires 458 in a wire-bonding manner, wherein the lead plane is in parallel with the substrate 490 of the second acceleration sensor chip 470.

The first acceleration sensor chip 420 is composed of the package 430 and the substrate 440. The second acceleration sensor chip 470 is composed of the package 480 and the substrate 490. Each of the packages 430, 480 includes an acceleration detection mechanism and related integrated circuits sufficient to sense along at least one axis. In one embodiment, the first acceleration sensor chip 420 is arranged to deal with two sensing directions, and can be used to perform acceleration detections along Z-axis and X-axis; and the second acceleration sensor chip 470 is arranged to deal with one single sensing direction, and can be used to perform acceleration detection along Y-axis. However, according to other embodiments of the present invention, the first acceleration sensor chip 420 may possess only one sensing direction and can be used to perform acceleration detections along a single axis, while the second acceleration sensor chip 470 may possess multiple sensing directions and can be used to perform acceleration detections along multiple axes. The combinations and alternative designs mentioned above all belong to the scope of the present invention.

Besides, for manufacturing convenience, each of the first acceleration sensor chip 420 and the second acceleration sensor chip 470 may be of the same chips, wherein each of the first acceleration sensor chip 420 and the second acceleration sensor chip 470 is capable of performing multi-axial acceleration detection. While being bonded to the lead plane, one of the acceleration sensor chips (e.g., the first acceleration sensor chip 420) is rotated and then placed on the package substrate 410, and is electrically connected to the package substrate 410; besides, one of the acceleration sensor chips has a portion of the contact pads that is not connected to the contact pads of the lead plane. That is, although the first acceleration sensor chip 420 and the second acceleration sensor chip 470 generate acceleration detection results associated with multiple directions, respectively, not all of the acceleration detection results are needed. In general, a three-axial acceleration sensor only requires sensing results in three different directions.

As can be learned from the above descriptions, the present invention implements conventional tri-axial sensor based sensing mechanisms and related integrated circuits in distinct chips, and then packages these chips as a sensing apparatus (sensor). As the sensing mechanism and the integrated circuit are no longer as dense as the conventional architecture, the present invention therefore solves/avoids the problems encountered by prior arts while achieving the same technical effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a multi-axial acceleration sensor, comprising:
   providing a substrate, wherein the substrate has a lead plane;
   disposing a first acceleration sensor chip onto the lead plane, wherein a wire bonding plane of the first acceleration sensor chip is perpendicular to the lead plane, comprising:
      connecting a plurality of contact pads of the wire bonding plane of the first acceleration sensor chip to a plurality of contact pads of the lead plane via a plurality of bonding wires; and
   disposing a second acceleration sensor chip onto the lead plane, wherein a wire bonding plane of the second acceleration sensor chip is in parallel with the lead plane.

2. The manufacturing method of claim 1, wherein the first acceleration sensor chip is arranged to deal with a first sensor direction and a second sensor direction, and the second acceleration sensor chip is arranged to deal with a third sensor direction, where the first sensor direction, the second sensor direction, and the third sensor direction are different from each other.

3. The manufacturing method of claim 1, wherein the first acceleration sensor chip is arranged to deal with a first sensor direction, and the second acceleration sensor chip is arranged to deal with a second sensor direction and a third sensor direction, where the first sensor direction, the second sensor direction, and the third sensor direction are different from each other.

4. The manufacturing method of claim 1, wherein the first acceleration sensor chip and the second acceleration sensor chip are of same chips.

5. A manufacturing method of a multi-axial acceleration sensor, comprising:
   providing a substrate, wherein the substrate has a lead plane;
   disposing a first acceleration sensor chip onto the lead plane, wherein a wire bonding plane of the first acceleration sensor chip is in parallel with the lead plane, comprising:
      connecting a plurality of soldering contacts of the wire bonding plane of the first acceleration sensor chip to a plurality of contact pads of the lead plane via a plurality of bonding wires; and
   disposing a second acceleration sensor chip onto the lead plane, wherein a wire bonding plane of the second acceleration sensor chip is in parallel with the lead plane.

6. The manufacturing method of claim 5, wherein the step of disposing the first acceleration sensor chip onto the lead plane comprises:
   fixing the first acceleration sensor chip onto the lead plane via solder between the wire bonding plane of the first acceleration sensor chip and the lead plane.

7. The manufacturing method of claim 5, wherein the first acceleration sensor chip is arranged to deal with a first sensor direction and a second sensor direction, and the second acceleration sensor chip is arranged to deal with a third sensor direction, where the first sensor direction, the second sensor direction, and the third sensor direction are different from each other.

8. The manufacturing method of claim 5, wherein the first acceleration sensor chip is arranged to deal with a first sensor direction, and the second acceleration sensor chip is arranged to deal with a second sensor direction and a third sensor direction, where the first sensor direction, the second sensor direction, and the third sensor direction are different from each other.

9. The manufacturing method of claim 5, wherein the first acceleration sensor chip and the second acceleration sensor chip are of same chips.

* * * * *